(12) United States Patent
Venaleck et al.

(10) Patent No.: US 9,300,066 B2
(45) Date of Patent: Mar. 29, 2016

(54) HIGH-VOLTAGE RESISTANCE AND RETENTION OF PRINTED FLEX CIRCUITS

(75) Inventors: John T. Venaleck, Painesville, OH (US); Larry Crofoot, Perry, OH (US)

(73) Assignee: Cardioinsight Technologies, Inc., Cleveland, OH (US)

( * ) Notice: Subject to any disclaimer, the term of this patent is extended or adjusted under 35 U.S.C. 154(b) by 219 days.

(21) Appl. No.: 14/115,599

(22) PCT Filed: May 3, 2012

(86) PCT No.: PCT/US2012/036272
§ 371 (c)(1),
(2), (4) Date: Feb. 14, 2014

(87) PCT Pub. No.: WO2012/151372
PCT Pub. Date: Nov. 8, 2012

(65) Prior Publication Data
US 2014/0193986 A1 Jul. 10, 2014

Related U.S. Application Data

(60) Provisional application No. 61/481,859, filed on May 3, 2011.

(51) Int. Cl.
*H01R 3/00* (2006.01)
*H01R 12/77* (2011.01)
*H05K 1/02* (2006.01)
(Continued)

(52) U.S. Cl.
CPC .......... *H01R 12/771* (2013.01); *H01R 12/7005* (2013.01); *H01R 12/772* (2013.01); *H01R 12/79* (2013.01); *H01R 13/03* (2013.01);
(Continued)

(58) Field of Classification Search
CPC ...... H01R 12/79; H01R 23/668; H01R 12/88; H01R 23/684; H01R 12/774
USPC ............................................ 439/495, 67, 492
See application file for complete search history.

(56) References Cited

U.S. PATENT DOCUMENTS 5,145,414 A * 9/1992 Oikawa ................... 439/620.34
5,385,478 A 1/1995 Niekawa
(Continued)

FOREIGN PATENT DOCUMENTS

EP 1953871 A2 8/2008
GB 1327194 A 8/1973
(Continued)

OTHER PUBLICATIONS

Supplementary European Search Report Application No. EP 12779940, Date of Completion of the Search: Feb. 5, 2015; 6 pp.
(Continued)

*Primary Examiner* — Phuong Dinh
(74) *Attorney, Agent, or Firm* — Tarolli, Sundheim, Covell & Tummino LLP

(57) ABSTRACT

A device includes an electrical connector coupled to the end of a flex circuit. The connector includes interior ribs that engage slots in the flex circuit, with the ribs and slots separating adjacent contact pads on the flex circuit. The contact pads are exposed portions of conductive traces on the flex circuit. Other portions of the conductive traces may be covered by a dielectric material, such as a non-conductive ink. The ribs provide an increased isolation path between the contact pads.

26 Claims, 3 Drawing Sheets

(51) Int. Cl.
  *H05K 1/11* (2006.01)
  *H01R 12/70* (2011.01)
  *H01R 12/79* (2011.01)
  *H01R 13/03* (2006.01)

(52) U.S. Cl.
  CPC ............. *H05K 1/0256* (2013.01); *H05K 1/117* (2013.01); *H05K 1/118* (2013.01); *H05K 2201/09063* (2013.01)

(56) References Cited

U.S. PATENT DOCUMENTS

| | | | |
|---|---|---|---|
| 5,488,345 A * | 1/1996 | Seki et al. | 337/186 |
| 5,860,832 A * | 1/1999 | Wayt et al. | 439/465 |
| 5,967,854 A * | 10/1999 | Craig | 439/676 |
| 7,238,032 B2 | 7/2007 | Pabst et al. | |
| 7,264,511 B2 * | 9/2007 | Asao | 439/620.27 |
| 7,628,618 B2 | 12/2009 | Wang et al. | |
| 2006/0286858 A1 | 12/2006 | Uchida et al. | |

FOREIGN PATENT DOCUMENTS

| | | |
|---|---|---|
| GB | 2315930 A | 2/1998 |
| JP | 2001/210408 A | 8/2001 |
| JP | 2001/307831 A | 11/2001 |
| JP | 2005/203104 A | 7/2005 |
| WO | WO 98/33246 A1 | 7/1998 |

OTHER PUBLICATIONS

PCT Int'l Search Report and Written Opinion—7 pgs., Nov. 16, 2012, CardioInsight Technologies, Inc.

* cited by examiner

HIGH-VOLTAGE RESISTANCE AND RETENTION OF PRINTED FLEX CIRCUITS

This application is a U.S. National Stage Application filed under 35 U.S.C. §371 of PCT/US2012/036272, having a filing date of May 3, 2012, which claims the benefit of U.S. Provisional Patent Application No. 61/481,859, filed on May 3, 2011, and entitled HIGH-VOLTAGE RESISTANCE AND RETENTION OF PRINTED FLEX CIRCUITS. The entire contents of each of the above-identified patent applications are incorporated herein by reference.

BACKGROUND

Electrical circuits can be manufactured by printing traces with conductive inks on substrates of thin plastic. These circuits are flexible and fragile. In order to provide connections to these circuits to the outside world, it is desirable to attach a connector to the circuit. These connectors will allow communications through cables or other circuits and the like. Normal methods of terminating connectors, such as soldering, are not possible because the materiel will melt. Therefore, it is desirable to capture the circuit in such a way that the connector grips the circuit for retention and contacts the circuit in compression. Usually, pads are provided at the edge of the circuit for this purpose. These pads are usually fairly close to one another to provide a reasonable geometric density.

The lateral distances between the pads can be as small as 0.020 inches. This close proximity will not allow very high voltage to exist between the adjacent pads without current leakage or voltage breakdown to occur. Therefore, it is desirable to have a connector for printed flexible circuits that provides compression contacts with pads in close array and that will provide both voltage isolation and mechanical retention.

SUMMARY OF THE INVENTION

According to an aspect of the invention, a printed flexible electrical circuit has output pads and slots at one edge, configured to allow very high voltage between pads without current leakage and to provide retention in a connector.

According to one aspect of the invention, rectangular section ribs are provided that act in conjunction with slots between the output pads of a printed flexible circuit. This combination of ribs and slots provide mechanical retention of the circuit.

According to another aspect of the invention, a connector with ribs also grips the circuit in compression to provide retention.

According to yet another aspect of the invention, a non-conductive ink is printed over the whole of the flexible circuit leaving pads exposed at the edge of the circuit.

According to another aspect of the invention, rectangular slots are provided that are located between the pads at the edge of the circuit and that extend well into the non-conductive ink overprint.

According to another aspect of the invention, the pads at the edge of the circuit do not extend all the way to the edge of the circuit.

According to yet another aspect of the invention, the rectangular slots provided between the pads extend toward the edge of the circuit, beyond the pads, but back from the edge by some amount.

According to another aspect of the invention, the ribs in the connector body fit the slots in the flexible circuit and extend beyond the pads both fore and aft.

According to another aspect of the invention, the ribs and slots are positioned such that a potential current path is lengthened, avoiding current leakage and voltage breakdown.

According to a further aspect of the invention, a combination of an electrical connector and a flex circuit that is coupled to the electrical connector may include one or more of the following features: the flex circuit has contact pads with slots between them; the slots are rectangular; the slots overlap the contact pads; the slots extend into a non-conductive ink region where a non-conductive ink layer covers conductive traces that terminated in the conductive pads; a substrate extends beyond the contact pads to the end of the flex circuit; the slots extend into the portion of the substrate beyond the contact pads; the connector has ribs that fit into the slots; the ribs are an integral part with one connector half of the connector; the ribs extend from one of the connector halves to the other half; the ribs and the slots provide mechanical retention of the flex circuit; the pads at the edge of the circuit do not extend all the way to the edge of the circuit; the rectangular slots provided between the pads extend toward the edge of the circuit, beyond the pads, but back from the edge by some amount; the ribs in the connector body fit the slots in the flexible circuit and extend beyond the pads both fore and aft; and the ribs and slots are positioned such that a potential current path is lengthened, avoiding current leakage and voltage breakdown.

According to another aspect of the invention, a device includes: an electrical connector; and a flex circuit that is coupled to the electrical connector. The flex circuit includes a substrate, with conductive traces that terminate in contact pads, and the flex circuit had slots between the contact pads.

According to yet another aspect of the invention, a flex circuit includes: a substrate; and conductive traces that terminate in contact pads. The flex circuit had slots between the contact pads.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The annexed drawings, which are not necessarily to scale, show various features of the invention.

DETAILED DESCRIPTION

A device includes an electrical connector coupled to the end of a flex circuit. The connector includes interior ribs that engage slots in the flex circuit, with the ribs and slots separating adjacent contact pads on the flex circuit. The contact pads are exposed portions of conductive traces on the flex circuit. Other portions of the conductive traces may be covered by a dielectric material, such as a non-conductive ink. The ribs provide an increased isolation path between the contact pads.

Figure 1:
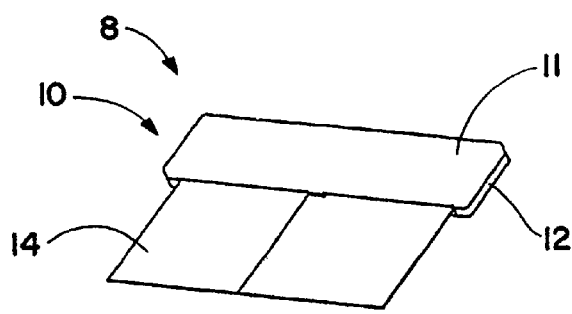
FIG. 1 is an oblique view of a device, in accordance with an embodiment of the invention.

FIG. 1 shows a device 8 that includes a connector 10 that is coupled to a flex circuit 14. The connector 10 is made up of a pair of connector halves 11 and 12 that couple together to clamp and hold the flex circuit 14.

Figure 2:
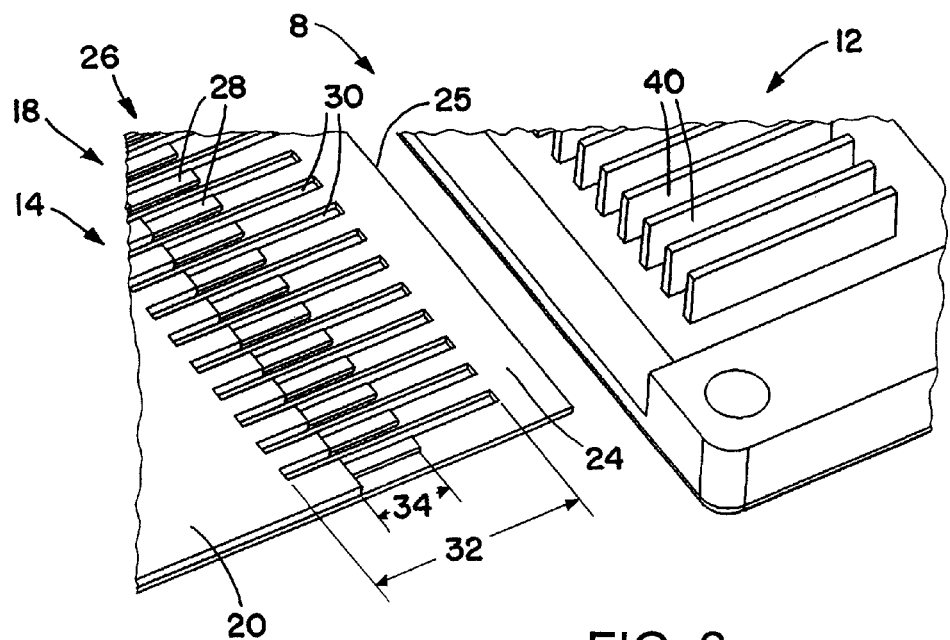
FIG. 2 is an oblique view of parts of the device of FIG. 1, with the flex circuit separated from the connector.

FIG. 2 shows further details of the flex circuit 14. The flex circuit 14 is made up of three layers: a plastic substrate 16, an intermediate conductive ink layer 18 on the substrate 16, and a top non-conductive ink layer 20 on the conductive ink 18. The conductive ink layer 18 includes a series of traces that may be substantially parallel to each other. The conductive ink 18 does not cover all of the substrate 16, leaving an end portion 24 of the substrate 16 bare. The end portion 24 is adjacent to an edge 25 of the substrate 16. The non-conductive ink 26 does not cover all of the conductive ink 18, leaving a portion 26 of the conductive ink 18 uncovered. The uncovered portions of the conductive ink traces form a series of contact pads 28.

The flex circuit 14 has a series of slots 30 between the contact pads 28. The slots 30 have a length 32 that is longer than a length 34 of the uncovered contact pads 28.

The slots 30 are used for engaging ribs 40 on the connector half 12, as also shown in FIG. 2. The ribs 40 fit in the slots 30 and provide insulation between adjacent of the conductor pads 28, as well as aiding in keeping the flex circuit 14 secured by the connector 10. The ribs 40 are made of plastic, molded as part of a single piece with the rest of the connector half 12.

Figure 3:
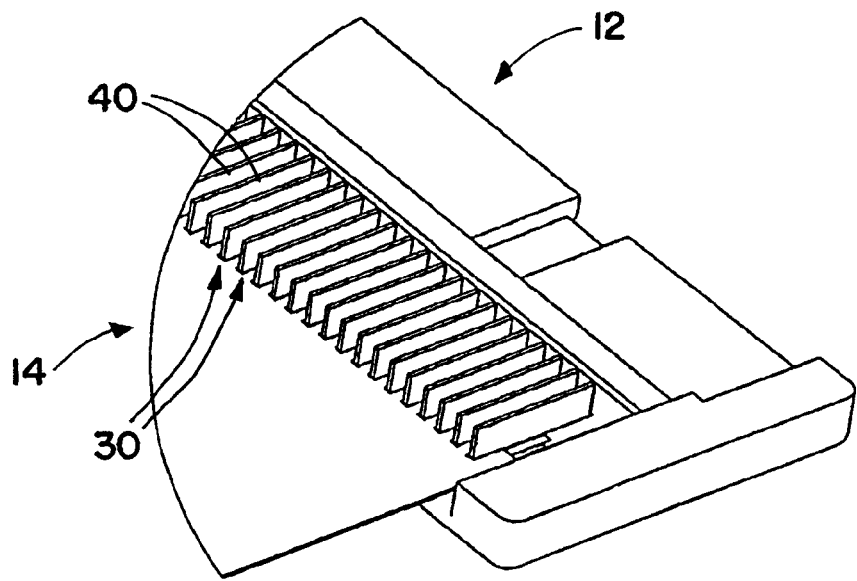
FIG. 3 is an oblique view, showing the parts of FIG. 2 engaged together.
Figure 4:
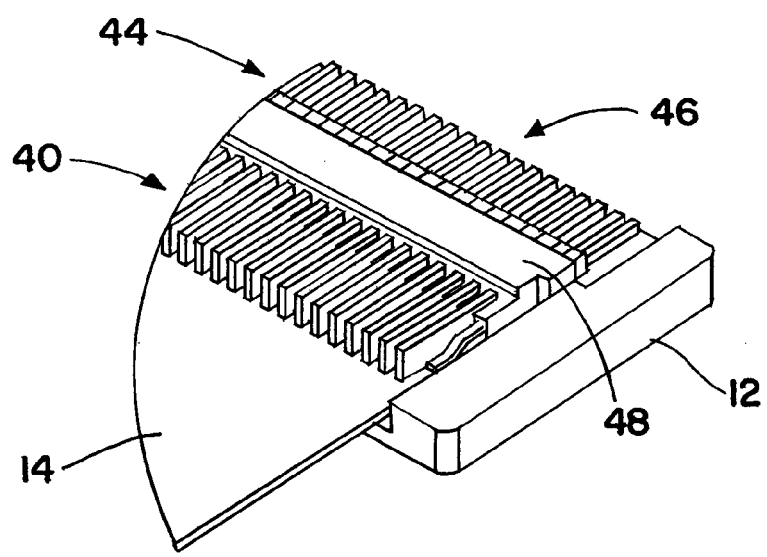
FIG. 4 is another oblique view, showing a header of the connector of the device of FIG. 1.
Figure 5:
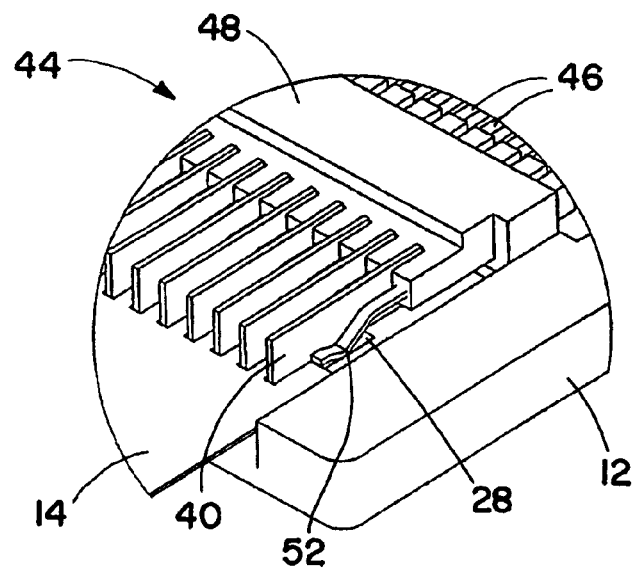
FIG. 5 is an enlarged view, showing engagement of contacts of the header of FIG. 4 with contact pads of the flex circuit.

FIG. 3 shows the flex circuit 14 installed on the connector half 12, with the ribs 40 engaging the slots 30. Referring now in addition to FIGS. 4 and 5, a header 44 of the connector 10 has conductive metal contacts 46 that are in a plastic header body 48. The contacts 46 are used to engage contacts in a mating connector (not shown) that is coupled to the connector 10. Alternatively the contacts 46 may be used to engage conductive pads or contacts on a circuit board or other device (not shown). The header body 48 may be molded around the contacts 46, to keep the contacts 46 place. After placement of the flex circuit 14 onto the ribs 40, the header 44 is put in place. Tails 52 of the contacts press against and engage the contact pads 28. When the connector 10 is assembled, the header body 48 is clamped between the connector halves 11 and 12 (FIG. 1). The connector halves 11 and 12 may be molded plastic parts that snap together to enclose the header body 48 between them. The connector half 11 may have suitable recesses (not shown) for receiving the ribs 40. This may result in a solid barrier of non-conductive plastic between adjacent of the contact pads 28, all the way from top to bottom of the connector 10, from one of the connector halves 11 and 12 to the other. The connector halves 11 and 12 may have suitable protrusions and recesses, such as suitable posts and holes, that allow alignment and connection between the connector halves 11 and 12. The connector halves 11 and 12 may be fit together and staked, or may be otherwise fastened together. The header body 48 may also have suitable protrusions that engage recesses in one or both of the connector halves 11 and 12. The recesses and protrusions may aid in providing proper alignment to the parts. The connector 10 grips the flex circuit 14, with the tails 52 pressed against the contact pads 28.

Figure 6:
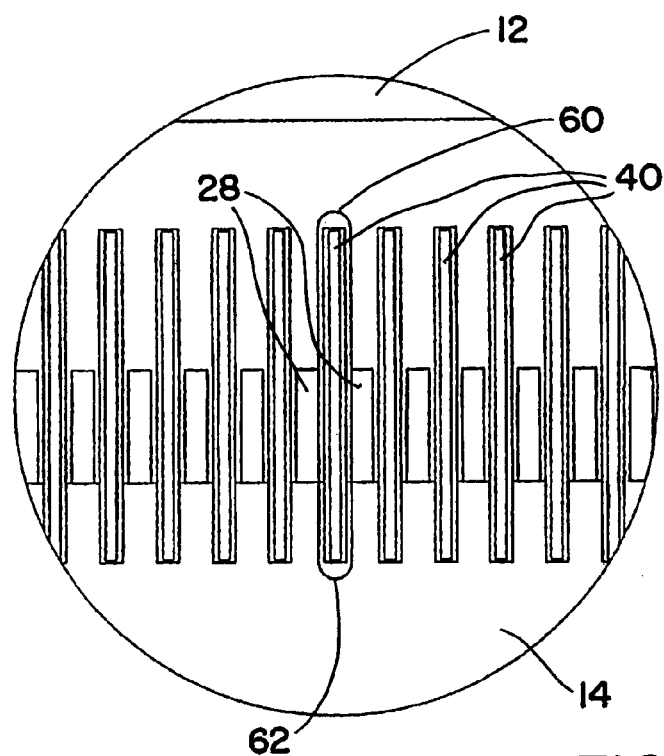
FIG. 6 is a plan view illustrating the long isolation paths in the device of FIG. 1.

FIG. 6 shows the usefulness of the ribs 40 in providing isolation of the contact pads 28 from one another. When the flex circuit 14 is installed on the connector half 12 the ribs 40 provide electrical isolation that prevents a high voltage pulse from going directly from adjacent contact pads 28, thus preventing voltage breakdown and/or current leakage. Instead a signal must travel a long isolation path around the ends of the ribs 40 to get from one of the contact pads 28 to an adjacent contact pad 28. Examples of such isolation paths are the isolation paths 60 and 62 around the opposite ends of one of the ribs 40. Since the ribs 40 are much longer than the contact pads 28 the ribs 40 overlap the contact pads 28 by an appreciable amount at either end. By providing an increased path length between the contact pads 28, the contact pads 28 may be closely spaced together, even when carrying high voltages, while still being able to maintain good electrical isolation. Current leakage and voltage breakdown is thus prevented.

Many variants are possible regarding the above device and method. For example device may include any suitable number of contacts, as well as various configurations for the contacts.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A device comprising:
   an electrical connector; and
   a flex circuit that is coupled to the electrical connector;
   wherein the flex circuit includes a substrate, with conductive traces that terminate in contact pads;
   wherein the flex circuit has slots between the contact pads;
   wherein the slots extend into a non-conductive layer region where a non-conductive layer covers the conductive traces that terminate in the contact pads; and
   wherein the non-conductive layer covers substantially all of a width of the flex circuit.

2. The device of claim 1, wherein the substrate extends beyond the contact pads to the end of the flex circuit.

3. The device of claim 2, wherein the slots extend into a portion of the substrate beyond the contact pads.

4. The device of claim 3, wherein the slots are back from an edge of the flex circuit that is beyond the contact pads, by a predetermined amount.

5. The device of claim 1, wherein the slots overlap the contact pads.

6. The device of claim 1, wherein the slots are rectangular.

7. The device of claim 1, wherein the contact pads do not extend all the way to an edge of the flex circuit that is beyond the contact pads, with the contact pads beyond offset from the edge by a predetermined amount.

8. The device of claim 1, wherein the conductive traces are made of conductive ink.

9. The device of claim 1, wherein the connector has ribs that fit into the slots.

10. The device of claim 9, wherein the ribs are an integral part with one connector half of the connector.

11. The device of claim 10, wherein the ribs extend from the one connector half to another connector half of the connector.

12. The device of claim 9, wherein engagement of the ribs and the slots provides mechanical retention of the flex circuit in the connector.

13. The device of claim 9, wherein the ribs in the connector body fit the slots in the flex circuit and extend beyond the contact pads both fore and aft of the contact pads.

14. The device of claim 9, wherein the ribs and slots are positioned such that a potential current path is lengthened, avoiding current leakage and voltage breakdown.

15. The device of claim 9, wherein respective of the ribs are located between respective of adjacent pairs of the contact pads.

16. The device of claim 9, wherein the connector includes conductive contacts that press against respective of the contact pads.

17. The device of claim 16, wherein the contacts are in a header body clamped between connector halves of the connector.

18. A flex circuit comprising:
a substrate; and
conductive traces that terminate in contact pads;
wherein the flex circuit has slots between the contact pads;
wherein the slots extend into a non-conductive region where a non-conductive layer covers the conductive traces that terminate in the contact pads; and
wherein the non-conductive layer covers substantially all of a width of the flex circuit.

19. The device of claim 18, wherein the substrate extends beyond the contact pads to the end of the flex circuit.

20. The device of claim 19, wherein the slots extend into a portion of the substrate beyond the contact pads.

21. The device of claim 20, wherein the slots are back from an edge of the flex circuit that is beyond the contact pads, by a predetermined amount.

22. The device of claim 18, wherein the slots overlap the contact pads.

23. The device of claim 18, wherein the slots are rectangular.

24. The device of claim 18, wherein the contact pads do not extend all the way to an edge of the flex circuit that is beyond the contact pads, with the contact pads beyond offset from the edge by a predetermined amount.

25. The device of claim 18, wherein the conductive traces are made of conductive ink.

26. The device of claim 18, wherein the substrate is a plastic substrate.

* * * * *